US007616767B2

(12) United States Patent
Geiger et al.

(10) Patent No.: US 7,616,767 B2
(45) Date of Patent: Nov. 10, 2009

(54) METHOD AND DEVICE FOR DETERMINING ACOUSTICAL TRANSFER IMPEDANCE

(75) Inventors: Klaus Geiger, Heubach (DE); Christian Glandier, Esslingen (DE); Rolf Helber, Schorndorf (DE)

(73) Assignee: Bruel & Kjaer Sound & Measurement A/S, Naerum (DK)

( * ) Notice: Subject to any disclaimer, the term of this patent is extended or adjusted under 35 U.S.C. 154(b) by 232 days.

(21) Appl. No.: 10/550,679

(22) PCT Filed: Apr. 14, 2004

(86) PCT No.: PCT/DK2004/000269

§ 371 (c)(1), (2), (4) Date: Nov. 8, 2005

(87) PCT Pub. No.: WO2004/092700

PCT Pub. Date: Oct. 28, 2004

(65) Prior Publication Data

US 2006/0126855 A1 Jun. 15, 2006

(30) Foreign Application Priority Data

Apr. 15, 2003 (DK) .............................. 2003 00589

(51) Int. Cl.

| | |
|---|---|
| ***H03G 3/20*** | (2006.01) |
| ***H04R 29/00*** | (2006.01) |
| ***H04R 5/00*** | (2006.01) |
| ***H04R 1/10*** | (2006.01) |
| ***H04R 3/00*** | (2006.01) |
| ***H04R 5/02*** | (2006.01) |
| ***G01D 3/00*** | (2006.01) |

(52) U.S. Cl. ............................ 381/57; 381/56; 381/59; 381/1; 381/17; 381/19; 381/74; 381/300; 381/96; 381/60; 702/108; 702/110; 702/109; 702/111; 702/112

(58) Field of Classification Search ............. 381/55–60, 381/1, 17, 19, 300, 307, 309, 310, 26, 74, 381/96; 702/108–112

See application file for complete search history.

(56) References Cited

U.S. PATENT DOCUMENTS 4,631,962 A 12/1986 Genuit (Continued)

FOREIGN PATENT DOCUMENTS

DE 27 16 345 A1 10/1978

(Continued)

OTHER PUBLICATIONS

Applicant's admitted prior art, p. 1, line 26-p. 3, line10.*

(Continued)

*Primary Examiner*—Devona E Faulk
(74) *Attorney, Agent, or Firm*—Oliff & Berridge, PLC

(57) ABSTRACT

The method comprises generating an acoustical volume velocity Q in the listening position, measuring a response quantity p, such as sound or vibration, at a suspected source position resulting from the volume velocity Q, and determining the acoustical transfer impedance $Z_t$ as the response quantity p divided by the acoustical volume velocity Q, $Z_t$=p/Q. According to the invention the acoustical volume velocity Q is generated using a simulator (10) simulating acoustic properties of at least a head of a human being, the simulator comprising a simulated human ear (14, 15) with an orifice in the simulated head and a sound source (30) for outputting the acoustical volume velocity Q through the orifice. The output volume velocity Q from the orifice of an ear is estimated from measurements with two microphones inside the corresponding ear canal.

14 Claims, 2 Drawing Sheets

U.S. PATENT DOCUMENTS 4,739,513 A * 4/1988 Kunugi et al. ............... 381/103

FOREIGN PATENT DOCUMENTS

| | | | |
|---|---|---|---|
| DE | 2716345 | A1 * | 10/1978 |
| GB | 2 373 622 | A | 9/2002 |
| JP | A-54-039601 | | 3/1979 |
| JP | A-60-254997 | | 12/1985 |
| JP | A-07-264632 | | 10/1995 |

OTHER PUBLICATIONS

Applicant's admitted prior art, p. 1, line 26-p. 3, line 15.*
Applicant's admitted prior art, p. 1, line 25-p. 3, line 15.*

* cited by examiner

METHOD AND DEVICE FOR DETERMINING ACOUSTICAL TRANSFER IMPEDANCE

FIELD OF THE INVENTION

This invention relates to the investigation of transmission of sound from a sound source such as a noise source to a listening position of a human being.

BACKGROUND OF THE INVENTION

Protection of the environment and human beings has become more and more important. Buildings, cars, buses, aircraft, household appliances and industrial machinery have noise producing components such as engines, motors, gears, transmissions etc. In order to protect individuals from such noise, the noise generating components and the transmission path of the noise to a human being have been investigated with the purpose of reducing the generated noise at the source and of reducing the noise transmitted from the source to human beings.

Testing of acoustic properties of noise generating and noise transmitting media such as mechanical structures and air or other fluids is an important part of the process of noise reduction. In complex structures with several noise sources, such as mentioned above, it can be complicated to identify noise sources and transmission paths and their contributions to the perceived noise.

Computerized methods exist for analyzing physical structures, and mathematical models of analyzed structures can be made. Acoustical tools exist for simulating acoustic properties of portions of a human being, such as Mouth Simulator type 4227, Ear Simulators types 4185 and 4195, Head and Torso Simulator types 4100 and 4128, all from Brüel & Kjaer Sound and Vibration Measurement A/S. All of these are intended for use in analyzing sound at different stages in its "normal" forward transmission from the source to a human being.

The transfer function for sound from a sound source to a point of measurement is often expressed as the acoustical transfer function or transfer impedance $Z_t$ defined as $Z_t$=p/Q, where Q is the volume velocity from the sound source, and p is the sound pressure at the point of measurement resulting from the volume velocity generated by the sound source. In most cases the analyzed mechanical and acoustical transmission media are reciprocal, which means that the acoustical transfer function is the same both for forward and reverse transmission. In other words, if the sound source and the measuring microphone are interchanged, whereby the transmission of sound through the structure is reversed, and boundary conditions remain unchanged, then the acoustical transfer impedance is unaffected, ie the "forward" acoustical transfer impedance and the "reverse" acoustical transfer impedance are identical.

For measurements of the acoustic transfer impedance it is necessary to know the volume velocity of the output sound signal. This is true both for measurements in the forward direction and in the reverse direction. It is known to use this fact when analyzing the transmission of sound, whereby a sound source is placed in a position that is normally occupied by a human being, ie a "listening" position, and a microphone is placed in the normal position of the sound source. This has distinct advantages when identifying sound sources and tracking the noise on its path from the source to listening position.

When measuring the forward transmission path a Head and Torso Simulator type 4100 from Brüel & Kjaer Sound and Vibration Measurement A/S can be placed in the listening position, whereby very realistic measurements of the forward transmission path can be obtained. However, when measuring the reverse transmission path with today's technology one still has to use a traditional sound source in the listening position, and traditional loudspeakers suffer form the drawback that they do not simulate any acoustic properties of a human being. The Mouth Simulator type 4227 and the Torso Simulator type 4128, both from Brüel & Kjaer Sound and Vibration Measurement A/S, each simulates the acoustic properties of the mouth of a human being very well, but this property of the commercially available simulators is irrelevant to measurements using the reverse transmission path. There is thus a need for a sound source for use in such measurements.

DE 2 716 345 discloses a dummy head with two built-in loudspeakers for emitting stereophonic sound through the two ears of the dummy head; in particular stereophonic sound recordings made with a dummy head having microphones in its ears.

U.S. Pat. No. 4,631,962 discloses an artificial head measuring system composed of geometric bodies for simulating acoustic properties of a human head. Microphones are disposed in the auditory canals of the artificial head. In relation to the instant invention the artificial head measuring system of U.S. Pat. No. 4,631,962 corresponds to the above-mentioned Head and Torso Simulator type 4100 from Brüel & Kjaer Sound and Vibration Measurement A/S.

JP 07 264632 discloses a dummy head with a pair of microphones for making stereophonic sound recordings and a pair of cameras for making stereoscopic video recordings simultaneously with the sound recordings.

JP 60 254997 discloses a system including a dummy mannequin with microphones in its ears for measuring acoustic transfer characteristics e.g. in an automobile using the forward transmission path.

SUMMARY OF THE INVENTION

The invention solves this problem by using a simulator simulating acoustic properties of a human being, where the simulator according to the invention has an orifice in the simulated head that simulates an ear of the simulated human being, and a sound source for outputting sound signals through the orifice to create a sound field around the simulator that simulates a sound field around a human being.

Such a simulator completes the reverse measuring chain and can be placed in a position that is normally occupied by a human being, ie a "listening" position. Boundary conditions in the "reverse" measuring path remain identical to those in the "forward" measuring path, whereby identity between "forward" and "reverse" measurements is ensured: The volume velocity of the sound output through the simulated ear or ears is measured, and one or more measuring microphones measure the resulting sound pressure at one or more positions. The acoustical transfer function is then calculated in accordance with the formula given above.

Further, also vibration transducers such as accelerometers can be used instead of or in combination with measuring microphones. The use of vibration transducers in a forward or reverse path measurement makes it possible to measure the transfer function between mechanical excitation of a structure in a particular point and the sound level of the radiated sound in a "listening" position caused by the mechanical excitation.

The simulator of the invention can have one or two orifices simulating a left ear and right ear respectively of the simulated human being, and means can then be provided for selectively outputting sound signals through either of the simulated ears.

DETAILED DESCRIPTION OF THE INVENTION

The invention is described with reference to the FIGS. 1-3. In the following, for simplicity all structures of the simulator that simulate portions of a human body are named as the corresponding human anatomical structures, which they are simulating. Thus, the structure of the simulator that simulates a human ear is referred to as an "ear" and not as a "simulated ear".

Figure 1:
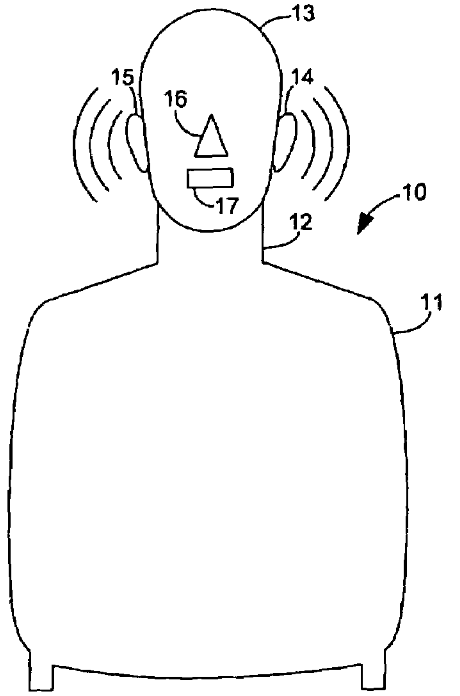
FIG. 1 shows a front view of a simulator of the invention.

FIG. 1 shows a front view of a simulator 10 with a torso 11 and neck 12 carrying a head 13. On the head the simulator has a left ear 14 and a right ear 15 each of which is shown with a pinna. Further, the head has a nose 16 and a mouth 17.

Figure 3:
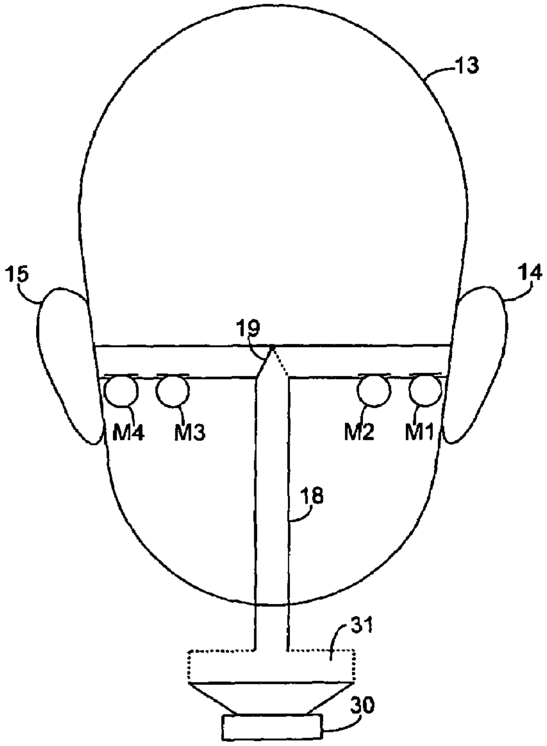
FIG. 3 shows schematically the arrangement in the simulator of FIG. 1 for providing sound output through either one of the simulated ears of the simulator in FIG. 1.

FIG. 3 shows schematically the interior of the head 13 of the simulator 10. Inside the simulator, preferably in the torso 11 or possibly in the neck 12, is a loudspeaker 30. The loudspeaker 30 is connected via a duct 18 to both ears 14 and 15. The duct 18 has a vertical portion and is branching like a "T" to the ears. The branching may also be in the form of a "Y" or other suitable branching. At the branching point there is provided a valve 19 or other suitable mechanism for directing sound from the loudspeaker 30 to either the left ear 14 or to the right ear 15. An operator can operate the valve 19 manually, or the set-up included in the box "signal generator and analyzer" can control it electrically. Each free end of the branches ends with an opening in the respective ear. In each of the branches are mounted a pair of microphones M1, M2 and M3, M4, respectively. The front side of the loudspeaker 30 is coupled to the duct 18 via an adaptor cavity 31 that acoustically adapts the loudspeaker 30 to the duct 18. When connected to a proper signal source the loudspeaker 30 will generate sound signals into the adaptor cavity 31, from where the sound signals will propagate into the duct 18 and leave the duct branches through one of the ears.

Figure 2:
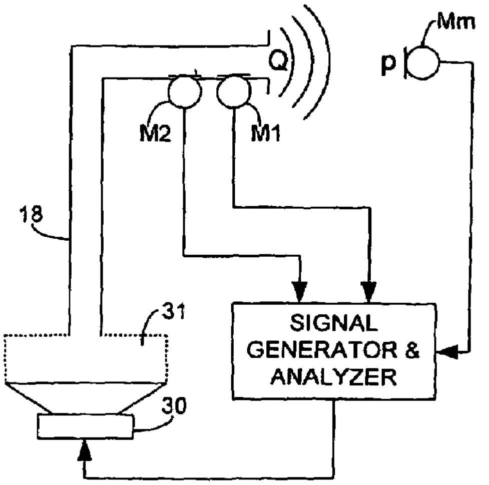
FIG. 2 shows schematically the principle of measurement for measuring the sound output from one simulated ear of the simulator in FIGS. 1 and 3.

FIG. 2 shows schematically a set-up for generating a sound output through one of the ears of the simulator 10 as shown in FIG. 3, and for measuring the volume velocity of the sound output. The set-up comprises the loudspeaker 30, the adaptor cavity 31, the duct 18 and the two microphones M1 and M2. Typically, the microphones M1 and M2 are situated in the duct 18 at distances 2 cm and 4 cm, respectively, from the free outer end of the duct; these distances depend on the upper frequency of interest. Instruments including in particular a signal generator and an analyzer, which, for reasons of simplicity, are shown as one block, generate an electrical signal that is fed to the loudspeaker 30, which generates a sound signal corresponding to the electrical signal from the signal generator. The thus generated sound signal propagates via the adaptor cavity 31 through the duct 18 and exits through the free end of the duct, ie through the left ear 14 of the simulator. The two microphones M1 and M2 are placed in the duct at a well-defined distance from each other and from the free outer end of the duct 18. The microphones M1 and M2 can be placed in the duct or, as indicated in the figures, in the wall of the duct with their sound sensitive element substantially flush with the duct wall. In case of condenser microphones their diaphragm is the sound sensitive element. The microphones each output an electrical signal in response to the sound pressure acting on their sound sensitive element. In case of condenser microphones it will be necessary to have a preamplifier or impedance converter immediately following the sound sensitive element. The output signals from the microphones, or from their preamplifiers, are fed to the analyzer, which analyses the signals received from the microphones. Based on the sound pressures measured simultaneously by the two microphones the volume velocity in the opening of the ear canal can be estimated at frequencies where only plane waves propagate in the ear canal.

A measuring microphone Mm can be placed anywhere and in particular in positions where it is desired to measure the sound that has propagated from the simulator. The measuring microphone Mm outputs an electrical signal representing the sound pressure at its location. The signal from the measuring microphone Mm is analyzed, e.g. as shown, in the block representing signal generator and analyzer. Instead of one measuring microphone Mm, several measuring microphones and/or vibration transducers can be used.

Figure 4:
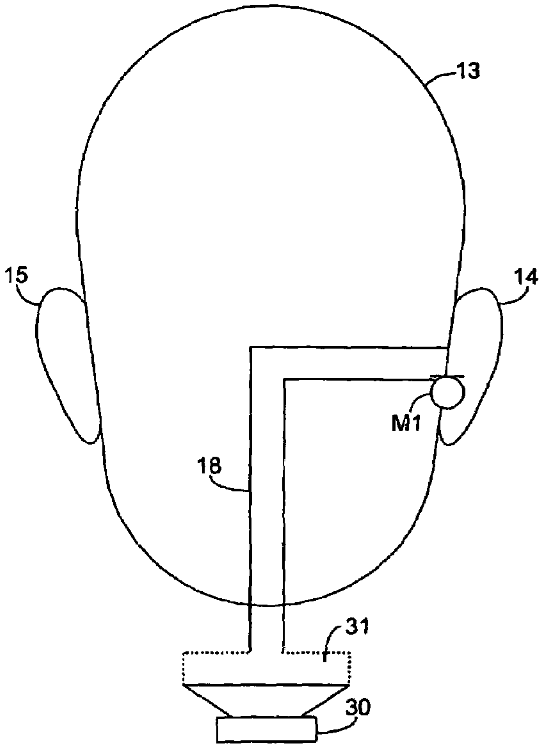
FIG. 4 shows schematically the arrangement in another embodiment of the simulator of the invention.

FIG. 4 shows a simpler embodiment of the invention where the duct 18 does not branch to both ears but only to the left ear 14. Instead of two measuring microphones only a single measuring microphone M1 is used here. The single measuring microphone M1 is placed at or near the outer end of the duct 18 where it used to measure the sound pressure. This is a simpler setup, which does not give the possibility of measuring the output sound volume velocity directly, but if free-field conditions are assumed, an approximation can be made.

Figure 5:
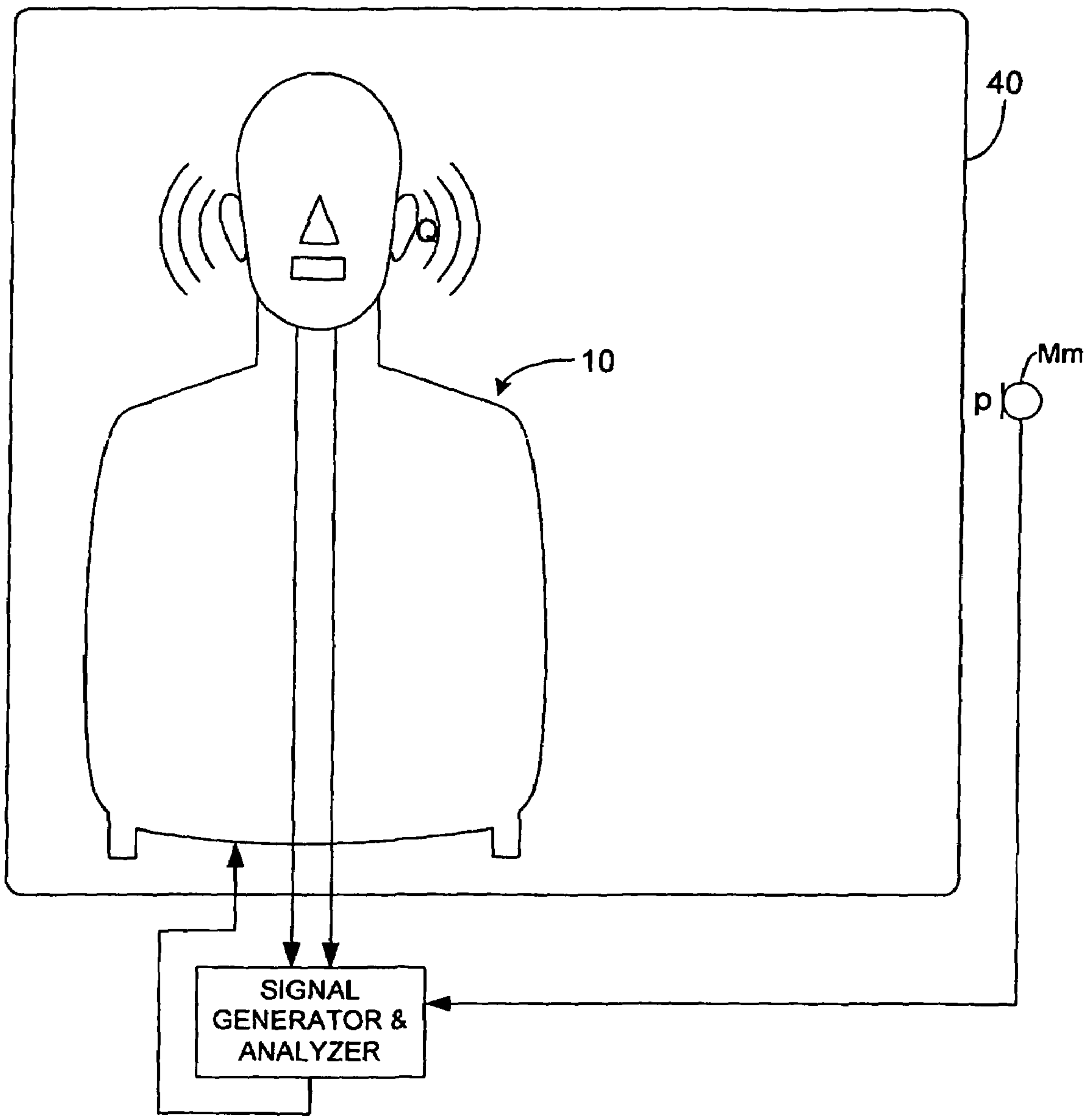
FIG. 5 illustrates the measuring method of the invention.

In FIG. 5 is illustrated the use of the simulator in the method according to the invention. The simulator 10 as described above is placed in the passengers' cabin 40 of an automobile, where the simulator can be placed in the driver's seat or in a passenger seat. A similar setup can be used for measurements in e.g. an aircraft, where the simulator is placed in a passenger's seat or in a seat intended for a member of the crew. The instruments included in the 'signal generator & analyzer' block can be placed at any convenient location inside or outside the automobile or aircraft. One or more measuring microphones Mm are placed in positions within or outside the cabin 40 and are connected to the analyzer. The actual positions of the measuring microphones Mm are chosen as positions to be examined for their possible contribution to the noise level at the listening position occupied by the simulator. An operator can move the measuring microphones to places of interest, or the microphones can be installed in predefined positions. Electrical excitation signals are fed to the loudspeaker 30 in the simulator, and corresponding sound signals are output through either of the ears 14, 15. By means of the pair of microphones M1 and M2 or M3 and M4, a pair of sound pressures is measured in the ear canal. In the analyzer the measured pair of sound pressures is processed and extrapolated to give the volume velocity output from the ear of the simulator, i.e. at the outer end of the ear canal. Each of the one or more measuring microphones Mm output an electrical signal representing the sound pressure level p at their respective location, and the analyzer performs the calculation of the acoustical transfer impedance $Z_t = p/Q$ between the listening position, i.e. the ear of the simulator, and the position of each of the measuring microphones Mm. The analyzer is preferably a digital FFT or SSR (steady state response) analyzer using digital algorithms.

Electrical excitation signals to the loudspeaker 30 in the simulator can be any suitable signal including pure sine wave, swept sine wave, stepped frequency sine wave, or the excitation signals can be random or pseudo-random signals including wide band signals, narrow band signals, or spectrum shaped wide band signals. Both steady state signals and transient signals are usable.

Instead of the one or more measuring microphones Mm vibration sensors such as accelerometers can be used to sense structural vibrations resulting from the sound generated by the simulator. The transfer impedance is then typically between structural vibration velocity (unit: $ms^{-1}$) and acoustic volume velocity (unit: $m^3s^{-1}$), and the unit of the transfer impedance will then be $m^{-2}$.

In the analyzer noise reduction methods can be used. Such methods include the use of fixed frequency and tunable band pass filters, correlation analysis etc., all of which are known in the art and do not form part of the invention.

REFERENCES

[1] Leo L. Beranek: Acoustics, McGraw-Hill Book Company, 1954, Library of Congress Catalog Card Number 53-12426, ISBN 07-004835-5, pages 8-15 and 40-46.

[2] Brüel & Kjaer Technical Review No. 3-1982, pages 3-39.

[3] Brüel & Kjaer Technical Review No. 4-1982, pages 3-32.

[4] Brüel & Kjaer Technical Review No. 4-1985, pages 3-31.

The invention claimed is:

1. A method of determining an acoustical transfer impedance $Z_t$ between a first position and a listening position of a human being, the method comprising:

generating an acoustical volume velocity Q in the listening position;

measuring a response quantity p at the first position resulting from the volume velocity Q; and determining an acoustical transfer impedance $Z_t$ as a response quantity p divided by the acoustical volume velocity Q, $Z_t$=p/Q, wherein the acoustical volume velocity Q is generated using a simulator simulating acoustic properties of at least a head of a human being, the simulator comprising a simulated human ear with an orifice in the simulated head and a sound source in the simulator for outputting the acoustical volume velocity Q through the orifice, so as to generate a sound field around the simulator that simulates a sound field around a human being.

2. A method according to claim 1, wherein the simulator simulates the head and a torso of a human being.

3. A method according to claim 1, wherein the simulator comprises a sound source in the interior of the simulator and a pair of microphones arranged to measure a pair of sound pressures in a canal leading from the sound source to the orifice, and that the method further comprises determining the volume velocity Q based on the pair of sound pressures.

4. A method according to claim 1, wherein the response quantity is sound pressure.

5. A method according to claim 1, wherein measuring the response quantity comprises at least one of measuring a sound pressure by at least one microphone and measuring structural vibrations by at least one vibration sensor.

6. A simulator for simulating acoustic properties of at least a head of a human being, the simulator comprising:

a simulated human ear with an orifice in the simulated head; and a sound source in the simulator for outputting an acoustical volume velocity Q through the orifice, so as to generate a sound field around the simulator that simulates a sound field around a human being.

7. A simulator according to claim 6, wherein the simulator simulates the head and a torso of a human being.

8. A simulator according to any claim 6, wherein the simulator comprises two orifices simulating a left ear and right ear respectively of the simulated human being.

9. A simulator according to claim 8, wherein means are provided for selectively outputting sound signals through the simulated left ear or through the simulated right ear.

10. A simulator according to claim 6, wherein the simulator comprises means for measuring the sound output from the simulated ears.

11. A simulator according to claim 10, wherein the means for measuring the sound output from the simulated ears comprises a pair of microphones for measuring the output sound volume velocity.

12. A simulator according to claim 6, further comprising:

a pair of microphones arranged to measure a pair of sound pressures in a canal leading from the sound source to the orifice, wherein the simulator is adapted to determine the volume velocity Q based on the pair of sound pressures; and wherein the sound source is in the interior of the simulator.

13. A simulator according to claim 6, wherein the simulator is adapted to:

generate the acoustical volume velocity Q in the listening position, measure a response quantity p at the first position resulting from the volume velocity Q, and determine an acoustical transfer impedance $Z_t$ as a response quantity p divided by the acoustical volume velocity Q, $Z_t$=p/Q, and wherein the response Quantity p is sound pressure.

14. A simulator according to claim 13, wherein the simulator is adapted to measure at least one of a sound pressure by at least one microphone and structural vibrations by at least one vibration sensor.

* * * * *